(12) United States Patent
Kobayashi

(10) Patent No.: US 8,989,889 B2
(45) Date of Patent: Mar. 24, 2015

(54) IDENTIFICATION INFORMATION SETTING DEVICE AND IDENTIFICATION INFORMATION SETTING METHOD

(75) Inventor: Hirohito Kobayashi, Kawasaki (JP)

(73) Assignee: Canon Anelva Corporation, Kanagawa (JP)

( * ) Notice: Subject to any disclaimer, the term of this patent is extended or adjusted under 35 U.S.C. 154(b) by 804 days.

(21) Appl. No.: 13/273,190

(22) Filed: Oct. 13, 2011

(65) Prior Publication Data

US 2012/0089243 A1 Apr. 12, 2012

Related U.S. Application Data

(63) Continuation of application No. PCT/JP2010/057591, filed on Apr. 28, 2010.

(30) Foreign Application Priority Data

Apr. 28, 2009 (JP) .................................. 2009-109290

(51) Int. Cl.
*H01L 21/677* (2006.01)
*H01L 21/67* (2006.01)

(52) U.S. Cl.
CPC .... *H01L 21/67745* (2013.01); *H01L 21/67294* (2013.01)
USPC .......................................................... 700/112

(58) Field of Classification Search
None
See application file for complete search history.

(56) References Cited

U.S. PATENT DOCUMENTS

| | | | |
|---|---|---|---|
| 5,153,829 A | 10/1992 | Furuya et al. | 364/419 |
| 5,845,137 A | 12/1998 | Tanaka | 395/750.05 |
| 6,634,845 B1 | 10/2003 | Komino | 414/217 |
| 7,959,395 B2 | 6/2011 | Hofmeister et al. | 414/217 |
| 2004/0151562 A1 | 8/2004 | Hofmeister et al. | 414/217 |
| 2005/0105991 A1 | 5/2005 | Hofmeister et al. | 414/217 |
| 2007/0183871 A1 | 8/2007 | Hofmeister et al. | 414/332 |
| 2009/0162179 A1 | 6/2009 | Hosek et al. | 414/749.2 |
| 2010/0152888 A1* | 6/2010 | Thorgrimson | 700/228 |
| 2011/0232844 A1 | 9/2011 | Hofmeister et al. | 156/345.31 |
| 2011/0280693 A1 | 11/2011 | Hofmeister et al. | 414/222.13 |

FOREIGN PATENT DOCUMENTS

| | | |
|---|---|---|
| JP | 5-57580 | 3/1993 |
| JP | 6-302668 | 10/1994 |
| JP | 6-348769 | 12/1994 |
| JP | 2001-2241 | 1/2001 |
| JP | 2003-068596 | * 3/2003 |
| JP | 2004-56122 | 2/2004 |
| JP | 2008-93751 | 4/2008 |
| JP | 2008-516457 | 5/2008 |

* cited by examiner

*Primary Examiner* — Sean Shechtman
*Assistant Examiner* — Steven Garland
(74) *Attorney, Agent, or Firm* — Fitzpatrick, Cella, Harper & Scinto

(57) ABSTRACT

The present invention provides an identification information setting device and an identification information setting method that can easily set identification information for a transfer chamber. In an embodiment of the present invention, a storage portion (31) stores field identification information that is previously set for each position where a transfer chamber having a transfer robot can be arranged. A reception portion (32) receives, as specification information, information on the position where the transfer chamber is actually arranged and the transfer chamber. The storage portion (31) stores correspondence between the actually arranged transfer chamber and identification information.

9 Claims, 5 Drawing Sheets

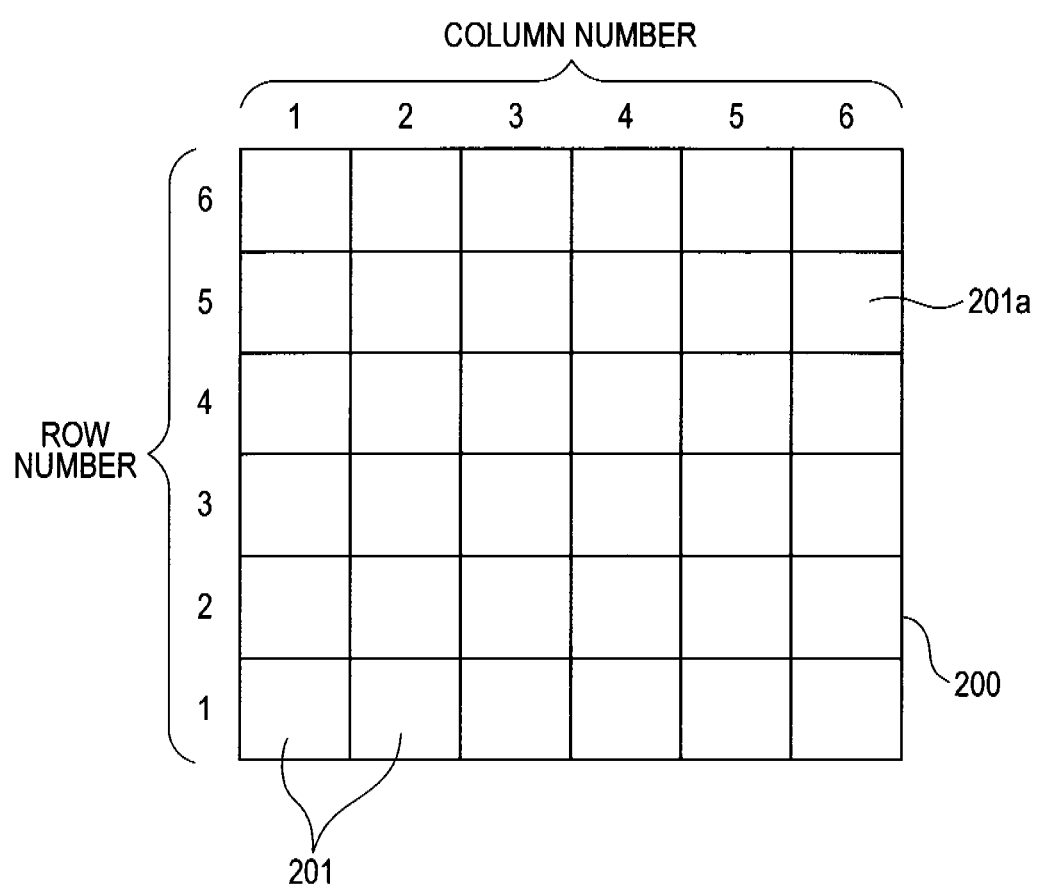

| MODULE ID | MODULE NAME | CORE ADDRESS | ADDRESS | PROFILE PATH |
|---|---|---|---|---|
| Ch-A | 5PVD Ch | 14 | 142 | ..... |
| Ch-B | Etch Ch | 24 | 242 | ..... |
| Ch-C | 5PVDEX Ch | 24 | 243 | ..... |
| Ch-D | ... | 24 | 244 | ..... |
| Ch-E | ... | 14 | 144 | ..... |
| ... | ... | ... | ... | ... | ic

IDENTIFICATION INFORMATION SETTING DEVICE AND IDENTIFICATION INFORMATION SETTING METHOD

CROSS-REFERENCES TO RELATED APPLICATIONS

This application is a continuation application of International Application No. PCT/JP2010/057591, filed Apr. 28, 2010, which claims the benefit of Japanese Patent Application No. 2009-109290, filed Apr. 28, 2009. The contents of the aforementioned applications are incorporated herein by reference in their entities.

TECHNICAL FIELD

The present invention relates to an identification information setting device of and an identification information setting method of setting, for a transfer chamber within a substrate processing system, identification information corresponding to an arrangement position of the transfer chamber.

BACKGROUND ART

Patent document 1 discloses a cluster system (a substrate processing system) that can additionally install a core module (transfer device) and a process module (processing device). In the control device of the cluster system, the address (identification information) of each module is set to specify the each module (each chamber).
[Patent document 1] Japanese Patent Application Publication laid-open No. 2001-2241

SUMMARY OF INVENTION

The identification information such as the address of each module used in the cluster system disclosed in patent document 1 or the like is uniquely set by the builder of the system each time the configuration of the cluster system is determined. Hence, the setting of the identification information of each module is time-consuming.

An object of the present invention is to provide an identification information setting device and an identification information setting method that can easily set identification information for a transfer chamber.

To achieve the above object, according to the present invention, there is provided an identification information setting device that gives, when a transfer chamber including substrate transfer means and a processing chamber are arranged in a predetermined arrangement relationship, an address to each of the transfer chamber and the processing chamber, the device including: display means that displays a region group for imaginarily developing the predetermined arrangement relationship, the region group including a plurality of regions; first storage means that stores identification information for specifying each of the plurality of regions of the region group; means that makes a user specify an arrangement position of the transfer chamber and an arrangement position of the processing chamber in the region group displayed on the display means; and means that gives an address to each of the transfer chamber and the processing chamber according to the arrangement position of the transfer chamber in the region group and the arrangement position of the processing chamber in the region group specified by the user through the means that makes the user specify and the identification information stored in the first storage means for each of the plurality of regions included in the region group.

According to the present invention, there is provided an identification information setting method of giving, when a transfer chamber including substrate transfer means and a processing chamber are arranged in a predetermined arrangement relationship, an address to each of the transfer chamber and the processing chamber, the method including: a step of displaying a region group for imaginarily developing the predetermined arrangement relationship, the region group including a plurality of regions; a step of making a user specify, in the displayed region group, an arrangement position of the transfer chamber and a connection port to which the processing chamber is connected among connection ports of the transfer chamber; and a step of acquiring identification information corresponding to the arrangement position of the transfer chamber in the region group from the arrangement position of the transfer chamber in the region group specified by the user and identification information for specifying each of the plurality of regions of the region group, determining the address of the transfer chamber from the acquired identification information and determining the address of the processing chamber from the determined address of the transfer chamber and the connection port among the connection ports of the transfer chamber which is specified by the user and to which the processing chamber is connected.

According to the present invention, there is provided an identification information setting method of giving, when a transfer chamber including substrate transfer means and a processing chamber are arranged in a predetermined arrangement relationship, an address to each of the transfer chamber and the processing chamber, the method including: a step of displaying a region group for imaginarily developing the predetermined arrangement relationship, the region group including a plurality of regions; a step of making a user specify an arrangement position of the transfer chamber and an arrangement position of the transfer chamber in the displayed region group; and a step of acquiring identification information corresponding to the arrangement position of the transfer chamber in the region group and identification information corresponding to the arrangement position of the processing chamber in the region group from the arrangement position of the transfer chamber in the region group and the arrangement position of the processing chamber in the region group specified by the user and identification information for specifying each of the plurality of regions of the region group, and determining the addresses of the transfer chamber and the processing chamber from the acquired identification information.

The "identification information that is previously set for each position" includes a case where identification information is set for each position according to a predetermined identification information giving rule.

According to the present invention, it is possible to easily set identification information for a transfer chamber.

BRIEF DESCRIPTION OF THE DRAWINGS

FIG. 2 is an explanatory diagram showing an imaginary field according to the embodiment of the present invention;

DESCRIPTION OF EMBODIMENTS

Figure 1:
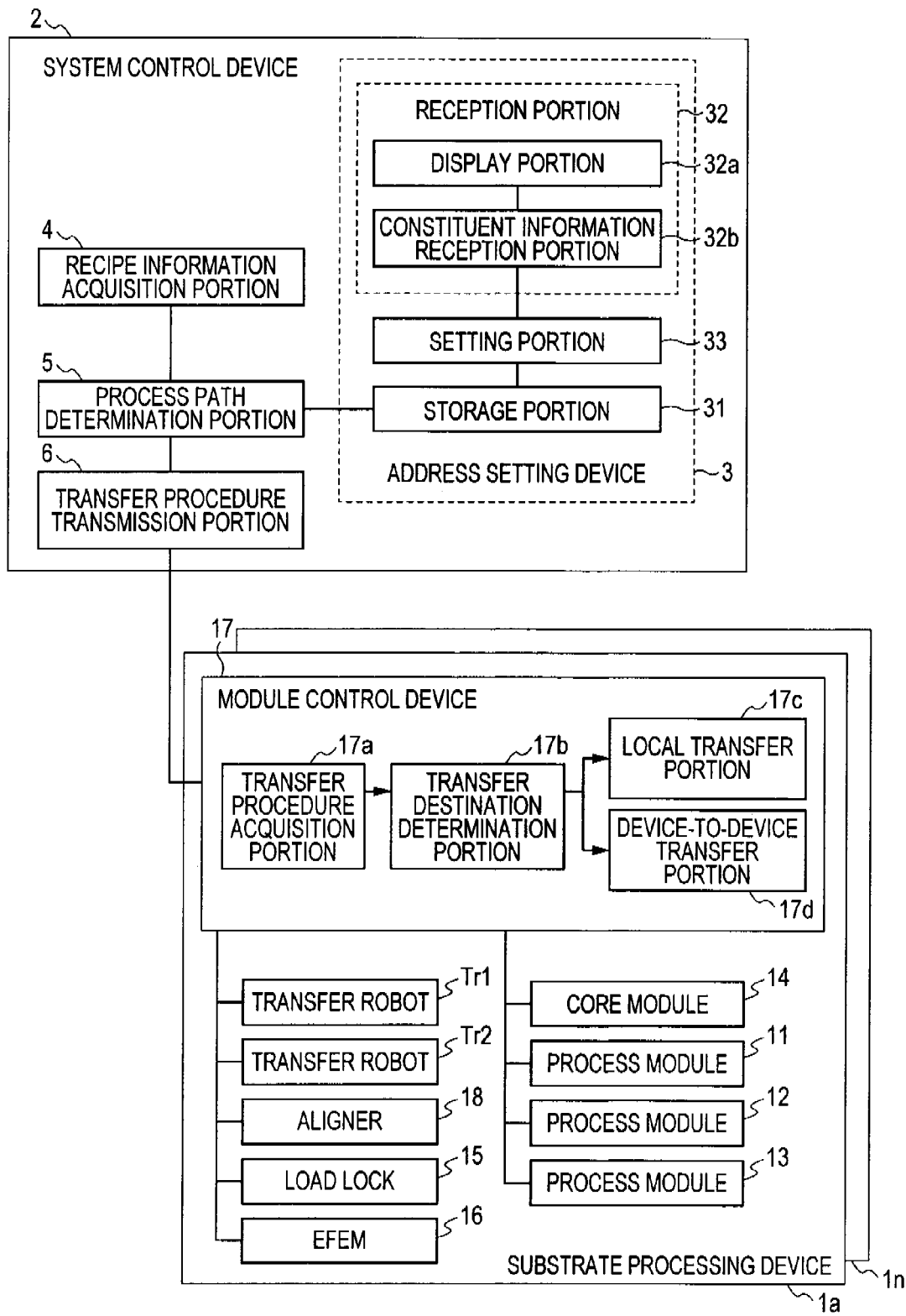
FIG. 1 is an explanatory diagram showing a substrate processing system according to an embodiment of the present invention.

FIG. 1 is an explanatory diagram showing a substrate processing system. In FIG. 1, the substrate processing system includes substrate processing devices 1a to 1n and a system control device 2. Each of the substrate processing devices 1a to 1n includes process modules 11 to 13, a core module 14, a load lock 15, an EFEM (Equipment Front End Module) 16 and a module control device 17. In the core module 14, transfer robots Tr1 and Tr2 and an aligner 18 are arranged. The number of process modules within each of the substrate processing devices 1a to 1n is not limited to three. The load lock 15, the EFEM 16 and the aligner 18 may be omitted. The number of transfer robots is not limited to two. The substrate processing devices 1a to 1n may be different from each other in the numbers of process modules, load locks 15, EFEMs 16, transfer robots and aligners.

The processing device and the process modules 11 to 13 to which a substrate is transferred include a chamber in which processing is performed on the substrate, for example, an etching chamber that can perform dry etching and the like, a temperature adjustment chamber that can perform heating and cooling or a film formation chamber. The film formation chamber is a chamber that can form a film by, for example, spattering or CVD (Chemical Vapor Deposition). Each of the process modules 11 to 13 is provided with substrate processing members such as an exhaust pump, a plasma generation power supply and a gas introduction system according to the type of chamber within the own module. Each of the process modules 11 to 13 is provided with a control device such as a PLC (programmable logic controller) that controls the substrate processing members within the own module and thereby has predetermined processing performed on the substrate.

The core module 14, which functions as a transfer device includes a transfer chamber in which the transfer robots Tr1 and Tr2 functioning as substrate transfer means and the aligner 18 are arranged. The transfer chamber has a plurality of connection ports that are connection portions on which connection can be performed. In the present embodiment, the transfer chamber has four connection ports. Needless to say, the number of connection ports included in the transfer chamber is not limited to four.

The core module 14 is connected through the connection ports to the process modules 11 to 13. The connection port to which the process module is connected among a plurality of connection ports is a connection portion. Moreover, the core module 14 can be connected to the core module within another substrate processing device through the connection port. In the core module 14, constituent elements such as a drive source for the exhaust pump and the aligner 18 are provided. Moreover, in the core module 14, the control device such as the PLC for controlling the constituent elements to have a substrate transfer operation performed is provided. The core module 14 uses the transfer robots Tr1 and Tr2 to transfer the substrate to the process modules 11 to 13. In the present embodiment, the transfer robots Tr1 and Tr2 each have an arm that freely rotates and expands and contracts, and transfer the substrate to the specified process modules 11 to 13. The aligner 18 receives and feeds the substrate between the transfer robots Tr1 and Tr2 and corrects the displacement of the substrate. The core module 14 can be connected through the load lock 15 to the EFEM 16, which is an input and output port. The load lock 15 is a device that introduces the substrate into a transfer line provided in the core module 14 and separates the substrate from the transfer line. The EFEM 16 is a device that introduces the substrate from the side of the atmosphere to the transfer line or the load lock 15, and that transfers the substrate to the side of the atmosphere.

The module control device 17 is formed with a PC (personal computer), the PLC and the like. The module control device 17 controls the process modules 11 to 13, the core module 14, the load lock 15, the EFEM 16, the transfer robots Tr1 and Tr2 and the aligner 18. The module control device 17 includes a transfer procedure acquisition portion 17a, a transfer destination determination portion 17b, a local transfer portion 17c and a device-to-device transfer portion 17d.

The transfer procedure acquisition portion 17a acquires, from the system control device 2, transfer procedure data that specifies the order of transfer of the substrate and the transfer destination. The transfer procedure data will be described later. The transfer procedure acquisition portion 17a supplies the transfer procedure data acquired from the system control device 2 to the transfer destination determination portion 17b.

When receiving the transfer procedure data, the transfer destination determination portion 17b determines whether or not the transfer destination of the substrate indicated by the transfer procedure data is a module within the substrate processing device to which the transfer destination determination portion 17b belongs or is a module within another substrate processing device. When the transfer destination of the substrate is a module within the substrate processing device to which the transfer destination determination portion 17b belongs, the transfer destination determination portion 17b supplies the transfer procedure data to the local transfer portion 17c. On the other hand, when the transfer destination of the substrate is a module within another substrate processing device, the transfer destination determination portion 17b supplies the transfer procedure data to the device-to-device transfer portion 17d.

When the local transfer portion 17c receives the transfer procedure data, the local transfer portion 17c has an operation of transferring the substrate to the module of the transfer destination indicated by the transfer procedure data performed by the transfer robot Tr1 or Tr2 within the substrate processing device to which the local transfer portion 17c belongs. When the device-to-device transfer portion 17d receives the transfer procedure data, the device-to-device transfer portion 17d has an operation of transferring the substrate to the core module within another substrate processing device indicated as the transfer destination by the transfer procedure data performed by the transfer robot Tr1 or Tr2 within the substrate processing device to which the device-to-device transfer portion 17d belongs.

The system control device 2 is formed with, for example, a PC including a user I/F (interface), and controls the substrate processing devices 1a to 1n. The system control device 2 may be formed with two or more PCs. The user I/F includes an input device such as a keyboard and a display device. The system control device 2 and the substrate processing devices 1a to 1n are connected to each other through a network conforming to a standard such as LAN (local area network) or RS-232C; they can perform data communication. The system control device 2 includes an address setting device 3 that is an embodiment of the present invention, a recipe information acquisition portion 4, a process path determination portion 5 and a transfer procedure transmission portion 6.

When the substrate processing devices 1a to 1n are combined as appropriate and arranged in a predetermined arrangement relationship, the address setting device 3 sets an address for each of the process modules 11 to 13 and the core module 14 within the substrate processing devices 1a to 1n. The address setting device 3 includes a storage portion 31 as first storage means and second storage means, a reception portion 32 as reception means and a setting portion 33 as setting means.

The system control device 2 includes a CPU (not shown), a memory portion (not shown) and the like. The CPU controls the entire system based on programs (for example, a program shown in FIG. 5) and the like stored in the memory portion, and comprehensively controls various types of processing performed within the address setting device 3. The memory portion includes the storage portion 31, a RAM that is a system work memory for the operation of the CPU, and a ROM and a hard disk drive that store the above programs and system software and the like. In the present embodiment, the CPU can perform various processing operations such as computation, control, determination and the like according to control programs such as for the processing related to the present embodiment stored in the ROM and hard disk drive.

The storage portion 31 stores identification information (hereinafter also referred to as "field identification information") that is previously set for each of a plurality of previously set regions. In the present embodiment, the regions (a region group) are formed by dividing a previously set field (hereinafter referred to as an "imaginary field"); on the regions, the core module as the transfer chamber and the process module as the processing chamber can be imaginarily developed. Each of the regions is a position where the transfer chamber can be arranged. The field identification information is identification information for the position where each transfer chamber is arranged when a plurality of transfer chambers is connected to each other. In other words, each place of a field (region) in the imaginary field is specified by the field identification information. Hence, an actual arrangement relationship between the core module and the process module is developed on the imaginary field, and thus it is possible to allocate a predetermined number to each module according to a predetermined rule.

FIG. 2 is an explanatory diagram showing an example of the imaginary field according to the present embodiment. In FIG. 2, a square imaginary field 200 is divided into regions 201 of six-row by six-column square. The respective regions 201 are equal in area to each other. The shape of the imaginary field is not limited to a square that is formed in a lattice-shaped region where the regions 201 are arranged in a lattice pattern. The shape of the region 201 is not limited to a square; it can be changed as appropriate according to the configuration of the core module (for example, the number of connection ports included in the core module); for example, it may be a regular hexagon. The number of regions 201 is not limited to 36. As the field identification information for each of the regions 201, the storage portion 31 stores a number (hereinafter referred to as a "row-column number") represented by a row number and a column number of the region 201. For example, since, in FIG. 2, the position of a region 201a within the imaginary field 200 is represented by five-row and the six-column, the row-column number of the region 201a is "56." Hence, the field identification information in each region 201 within the storage portion 31 also indicates the position (the position relationship between the row direction and the column direction) within the imaginary field of the regions 201.

As described above, the imaginary field where a plurality of regions for imaginarily arranging the core module and the process module is arranged is stored in the storage portion 31, and the field identification information for identifying the regions included in the imaginary field is also stored therein.

As described above, the shape of the region of the imaginary field is not limited to a quadrangle as shown in FIG. 2; for example, it may be any shape such as a hexagon, an octagon or the like. The shape of the region of the imaginary field is preferably the same as the shape of the core module that is a target of the arrangement. For example, when the shape of the core module that is the target of the arrangement is a quadrangle, the shape of the region of the imaginary field is preferably a quadrangle; when the shape of the core module is a hexagon, the shape of the region of the imaginary field is preferably a hexagon.

For each of expected shapes of the core module such as a quadrangle, a hexagon, an octagon and the like, unit lattices of polygon are arranged in a lattice pattern, an imaginary field having a predetermined number of unit lattices (regions) is prepared and they may be stored in the storage portion 31.

An imaginary field in which the predetermined number of unit lattices is stepwise changed may be prepared. For example, with respect to the unit lattices (regions) of quadrangle, in addition to 36 regions (=6×6) shown in FIG. 2, an imaginary field having 16 (=4×4) regions, an imaginary field having 100 (=10×10) regions and the like may be prepared and stored in the storage portion 31. As described above, the imaginary field in which the number of regions is changed is prepared, and thus it is possible to perform an address setting using an imaginary field of an appropriate size corresponding to a footprint.

With respect to the imaginary field, a typical imaginary field (for example, the imaginary field shown in FIG. 2) may be previously stored in the storage portion 31 at the time of shipment or may be downloaded through a network such as the Internet. Furthermore, a user may directly produce the imaginary field on the system control device 2. In this case, for example, a screen for the formation of the imaginary field is displayed on the display device included in the system control device 2, and the user arranges regions of a predetermined shape through the input device included in the system control device 2 and thereby may produce the imaginary field. When, as described above, the user sets the imaginary field, for each of the produced regions of the imaginary field, the field identification information for identifying each position is preferably allocated.

The reception portion 32 receives, as specification information, information (information indicating to which connection port of the transfer chamber the process module is connected) on regions where the transfer chamber (core module) is actually arranged and the transfer chamber (core module). In the present embodiment, the reception portion 32 receives constituent information indicating a correspondence region associated with the core module 14 among the plurality of regions 201 and the connection port (connection portion) to which the process modules 11 to 13 are connected among a plurality of connection ports included in the core module 14. The reception portion 32 includes a display portion 32a as display means and a constituent information reception portion 32b as specification acquisition means.

The display portion 32a displays a setting screen indicating the regions 201 on the display device included in the system control device 2. In the present embodiment, the display portion 32a displays the setting screen indicating the imaginary field 200 shown in FIG. 2.

Based on the specification of the position for the setting screen, the constituent information reception portion 32b acquires specification information of a position where the core module is arranged as the transfer chamber and information indicating to which connection port of the core module the process module is connected. In other words, the constituent information reception portion 32b acquires the constituent information based on the user input (the specification of the positions of the core module and the process module performed by the user on the setting screen shown in FIG. 2) input by the user through the input device included in the system control device 2. In the present embodiment, the constituent information reception portion 32b uses a square core icon associated with the core module 14 and a square process icon associated with the process modules 11 to 13, and thereby receives system information set on the setting screen as the constituent information. The system information indicates the correspondence region using a region (hereinafter referred to as a "setting region") on the setting screen where the core icon is set. Moreover, the system information indicates the connection portion using an adjacent portion between a connection portion specification portion included in the process icon and the setting region.

In other words, based on the user input performed on the imaginary field 200, the constituent information reception portion 32b acquires, as the constituent information, the arrangement position of the core module in the used imaginary field 200 and information indicating to which connection port of the core module the process module is connected. As described later, the information indicating to which connection port of the core module the process module is connected is acquired based on the arrangement position of the process module in the imaginary field 200. Therefore, the constituent information reception portion 32b acquires, according to the user input, the information indicating to which connection port of the core module the process module is connected from the arrangement position of the process module arranged on the imaginary field 200.

Figure 3A:
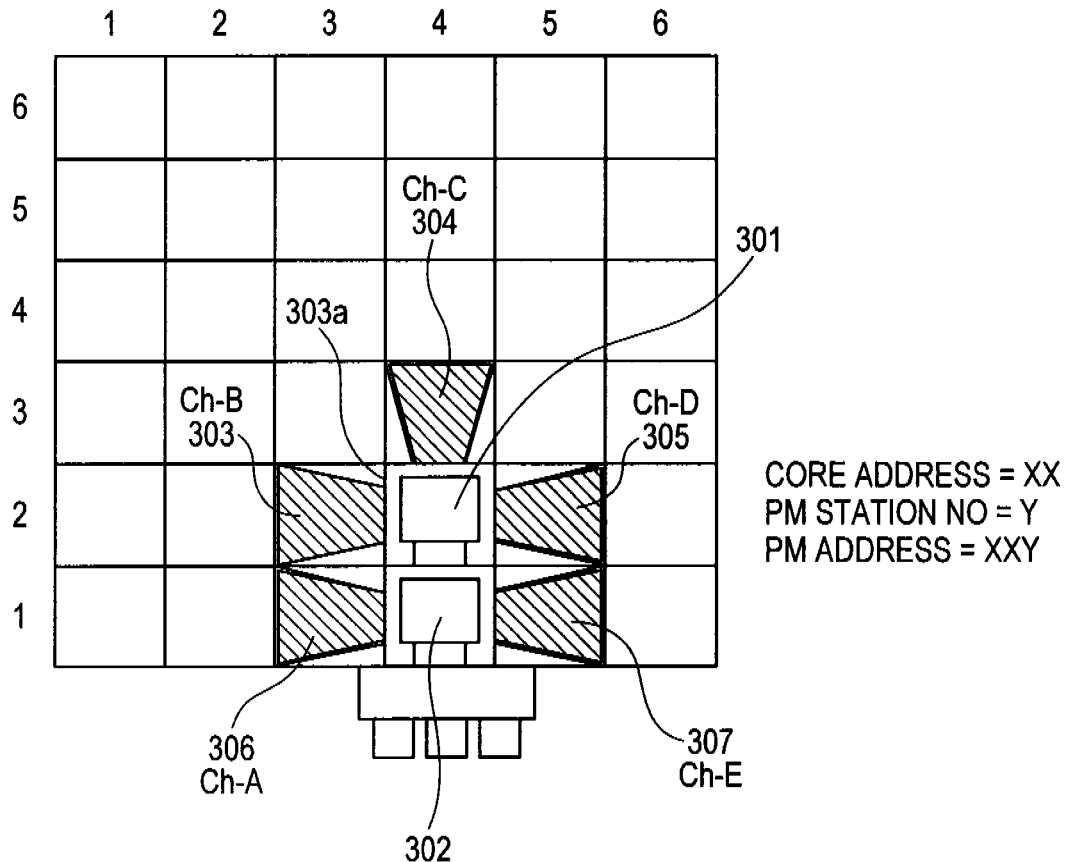
FIG. 3A is an explanatory diagram showing an example of system information according to the embodiment of the present invention.
Figure 3B:
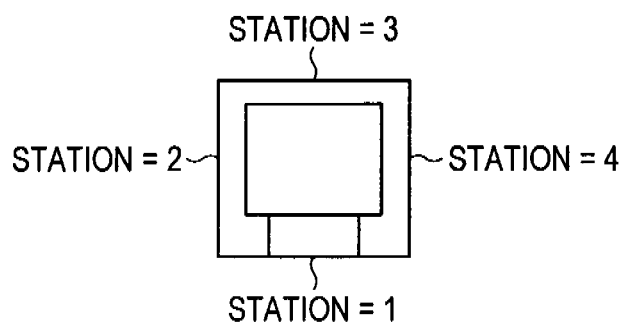
FIG. 3B is an explanatory diagram showing an example of an identification value of each side of a core icon according to the embodiment of the present invention.

FIG. 3A is a diagram showing an example of the system information. In FIG. 3A, a core icon 301 is assumed to be associated with the core module 14 within the substrate processing device 1a. A core icon 302 is assumed to be associated with the core module 14 within the substrate processing device 1n. Each side of the core icon indicates the position on the core module 14 where the connection port is placed. For each side of the core icon, an identification value for identifying the side is previously set. In the present embodiment, as shown in FIG. 3B, an identification value (station number) is assumed to be set for each side of the core icon. The storage portion 31 stores this identification value for each side of the core icon.

Although, in FIG. 3A, the shape of the core module that is actually arranged is a quadrangle and thus the shape of the core icon is set at a quadrangle, the shape of the core icon is not limited to a quadrangle, and it can be set at a shape corresponding to the shape of the actually arranged core module, such as a hexagon or an octagon. For example, when the core module of a hexagon is arranged, the core icon of a hexagon is preferably used. Here, as in the case shown in FIG. 3B, the identification value (station number) is preferably set for each side of the hexagon.

With respect to the core icon, a typical core icon (for example, the core icon shown in FIG. 3B) may be previously stored in the storage portion at the time of shipment or may be downloaded through a network such as the Internet. Furthermore, the user may directly produce the core icon on the system control device 2. When the user produces the core icon, the identification value (station number) is preferably set for each side of the produced core icon.

Process icons 303 to 305 are assumed to be respectively associated with the process modules 11 to 13 within the substrate processing device 1a. Process icons 306 and 307 are assumed to be respectively associated with the process modules 11 and 12 within the substrate processing device 1n. In each of the process icons, the connection portion specification portion indicating the connection portion to the core module is provided. In FIG. 3A, among the sides of the process icon, the shortest side of a diagonally shaded trapezoid is used as the connection portion specification portion.

In FIG. 3A, for example, the core icon 301 is arranged in the region 201 of the row-column number "24", which is the field identification information. Hence, the region 201 of the row-column number "24" is the correspondence region of the core module 14 within the substrate processing device 1a. For example, the process icon 303 is arranged in the region 201 of the row-column number "23", and the connection portion specification portion 303a of the process icon 303 is adjacent to the correspondence region (the region 201 of the row-column number "24") of the core module 14 within the substrate processing device 1a. The adjacent portion between the connection portion specification portion 303a and the region 201 of the row-column number "24" is the connection portion between the core module 14 and the process module 11 within the substrate processing device 1a. As described above, since, in the present embodiment, the connection portion specification portion is provided in the process icon, when the user develops, as shown in FIG. 3A, a desired arrangement on the imaginary field 200 and produces the constituent information, the user can visually check to which connection port of the core module which process module is connected. In this way, it is possible to accurately specify the connection port where the connection to the process module is performed in the core module among the constituent information required for the address allocation of the process module.

When the reception portion 32 receives the constituent information, the setting portion 33 refers to the constituent information and the field identification information stored in the storage portion 31 to set the addresses of each core module and each process module. The setting portion 33 first sets the address of each core module using the identification information for the correspondence region of the core module. In the present embodiment, the setting portion 33 sets, as the address of each core module, the identification information for the correspondence region of the core module. Then, the setting portion 33 sets the address of each process module based on the address of the core module to which the process module is connected and the connection portion between the core module and the process module indicated by the constituent information. In the present embodiment, the setting portion 33 sets, as the address of each process module, information obtained by adding the previously set value (station number) for the connection port of the connection portion to the address of the core module to which the process module is connected. The setting portion 33 also produces a correspondence table indicating the address of each process module, and stores the correspondence table in the storage portion 31.

Figures 4, 5:
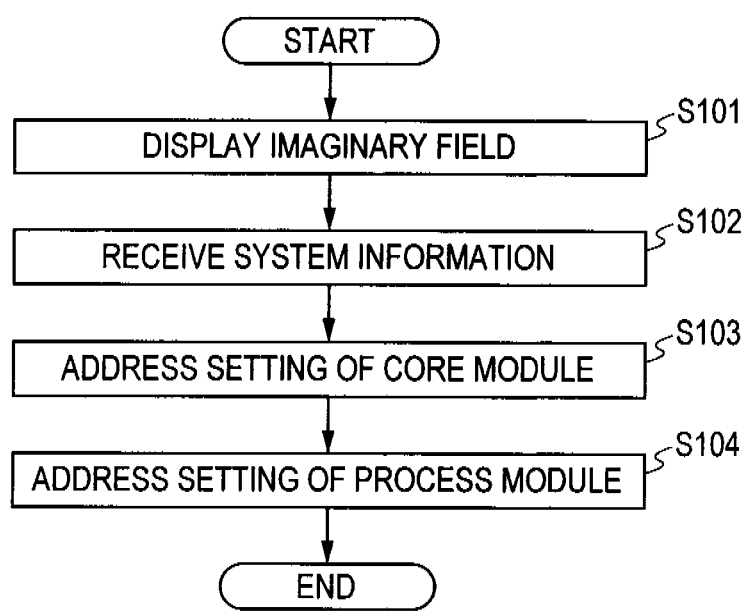
FIG. 4 is an explanatory diagram showing an example of a correspondence table according to the embodiment of the present invention.
FIG. 5 is a flowchart illustrating an address setting operation according to the embodiment of the present invention.

FIG. 4 is an explanatory diagram showing an example of the correspondence table. In FIG. 4, a module ID (module identification information), a module Name (module type information) and a profile path (a site where input data and the like are stored) are received by the user I/F within the system control device 2 and are recorded in the correspondence table.

Each process module set by the setting portion 33 and the address of each process module are also set in each of the substrate processing devices 1a to 1n. The setting in each of the substrate processing devices 1a to 1n may be performed by the setting portion 33 or by a system administrator. The setting portion 33 stores the constituent information in the storage portion 31.

The recipe information acquisition portion 4 acquires recipe information describing the procedure of processing for the substrate such as by input through the user I/F. The recipe information is, for example, PPID=Ch-A→Ch-C→Ch-B. In the recipe information (PPID), an ID (module identification information) for the module in which the substrate is transferred is used as transfer destination specification data. Moreover, in the recipe information (PPID), the process path between the modules is indicated by an arrow. Hence, the recipe information (PPID) indicates that the substrate is transferred in the order of the module identified by Ch-A, the module identified by Ch-C and the module identified by Ch-B and is processed (the order of the transfer and the transfer destination of the substrate). In the present embodiment, as the transfer destination specification data, process module identification information (Ch-ID) is basically used. As long as data can specify the transfer destination, its form is not limited; for example, a combination of the process module type information (Ch-Name) and other information may be used.

Based on the correspondence table within the storage portion 31, the process path determination portion 5 converts the transfer destination specification data (module ID) within the recipe information into the address of the module that is the transfer destination. The process path determination portion 5 determines the process path based on the recipe information with the transfer destination specification data converted into the address, the constituent information within the storage portion 31 and the field identification information for the regions. The transfer procedure transmission portion 6 produces transfer procedure data based on the process path determined by the process path determination portion 5, and transmits it to the module control device.

An address setting operation will now be described with reference to FIG. 5.

The display portion 32a displays the imaginary field 200 stored in the storage portion on the display device included in the system control device 2 (step S101). Under these conditions, when the user operates the input device included in the system control device 2, and uses the core icon and the process icon to produce the system information (see FIG. 3A), the constituent information reception portion 32b receives the system information (constituent information) (step S102). The constituent information reception portion 32b supplies the system information to the setting portion 33.

For example, when the station number 1 of the core module 14 of the substrate processing device 1a and the station number 3 of the core module 14 of the substrate processing device 1n are connected to each other, the process modules of module IDs Ch-B to Ch-D are respectively connected to the station numbers 2 to 4 of the core module 14 of the substrate processing device 1a and the process modules of module IDs Ch-A and Ch-E are respectively connected to the station numbers 2 and 4 of the core module 14 of the substrate processing device 1n, the following constituent information is produced.

That is, the user operates the input device, and arranges the core icon 301 in the second row and the fourth column and arranges the core icon 302 in the first row and the fourth column. By the user input as described above, the constituent information reception portion 32b accepts that the region in the second row and the fourth column of and the region in the first row and the fourth column of the imaginary field 200 are the arrangement regions (correspondence regions) of the core module. In other words, the constituent information reception portion 32b makes the user specify the arrangement positions of the core icons 301 and 302 corresponding to the core modules in the imaginary field 200, and also makes the user specify the correspondence region corresponding to the core module in the imaginary field 200.

Then, the user operates the input device, and arranges the process icon 303 in the region in the second row and the third column of the imaginary field 200 such that the connection portion specification portion 303a of the process icon 303 is adjacent to a side specified by the station number 2 of the core icon 301 arranged in the second row and the fourth column. Likewise, the user arranges the process icons 304 and 305 in the region adjacent to a side specified by the station numbers 3 and 4 of the core icon 301, and arranges the process icons 306 and 307 in the region adjacent to a side specified by the station numbers 2 and 4 of the core icon 302. By the user input as described above, the constituent information reception portion 32b acquires the arrangement positions of the process icons 303 to 307, and receives, through each of the connection portion specification portions of the process icons 303 to 307, information as to which sides of the core icons 301 and 302 are the connection portions to the process icons (that is, to which connection port of the core module the process module is connected). In other words, the constituent information reception portion 32b makes the user specify the arrangement positions of the process icons 303 to 307 corresponding to the process modules in the imaginary field 200, and also makes the user specify to which connection ports of the core modules 301 and 302 the core modules are connected.

In this way, the constituent information reception portion 32b receives the system information (constituent information) shown in FIG. 3A.

When the system information is received, the setting portion 33 refers to the system information and the field identification information within the storage portion 31, and first sets, as the address of each core module, the row-column number of the correspondence region of the core module (step S103). For example, if the system information is one shown in FIG. 3A, the setting portion 33 sets "24" as the address of the core module corresponding to the core icon 301, and sets "14" as the address of the core module corresponding to the core icon 302.

Then, based on the system information and an identification value (for example, the station number shown in FIG. 3B) allocated to each connection port of the core module stored in the storage portion 31, the setting portion 33 sets, as the address of each process module, information obtained by adding a preset identification value for the connection port of the connection portion to the address of the core module to which the process module is connected (step S104). If the system information is one shown in FIG. 3A, for example, the setting portion 33 sets "242" as the address of the process module corresponding to the process icon 303, and sets "243" as the address of the process module corresponding to the process icon 304. The setting portion 33 stores, in the storage portion 31, the address of each core module, the address of each process module and the system information.

Since, as described above, in the present embodiment, the imaginary field and the constituent information are used, the core module is arranged on the imaginary field so as to correspond to the actual arrangement, and thus it is possible to uniquely and automatically allocate the address of the core module. If the connection port which is the connection target to the process module in the core module can be specified, it is possible to automatically give a unique address to the process module in the arrangement.

When, as described above, in the present embodiment, if at least the position of the core module is accurately specified on the imaginary field and the user only specifies to which connection port of the core module the process module is connected, it is possible to automatically allocate addresses to the actually arranged core module and process module.

Processing for producing the transfer procedure data will now be described. When the recipe information acquisition portion 4 receives the recipe information (PPID), the recipe information acquisition portion 4 supplies the recipe information to the process path determination portion 5. The process path determination portion 5, when receiving the recipe information, converts, based on the correspondence table within the storage portion 31, the transfer destination specification data (module ID) within the recipe information into the address of the module that is the transfer destination. When receiving, for example, the recipe information "PPID=Ch-A→Ch-C→Ch-B," the process path determination portion 5 converts this recipe information into the recipe information "PPID=142→243→242."

Then, the process path determination portion 5 determines the process path based on the recipe information with the transfer destination specification data converted into the address, the constituent information within the storage portion 31 and the field identification information on the region. The process path determination portion 5 determines, for example, as a path for performing "142→243" within the recipe information "PPID=142→243→242", a process path for transferring the substrate between the core modules connected in the column direction of the column number "4." Moreover, the process path determination portion 5 determines the process path for transferring the substrate from the core module of the address "14" to the core module of the address "24." The process path determination portion 5 supplies the process path and the recipe information with the transfer destination specification data converted into the address to the transfer procedure transmission portion 6.

The transfer procedure transmission portion 6, when receiving the process path and the recipe information, produces the transfer procedure data and transmits the transfer procedure data to the module control device. The transfer procedure transmission portion 6 produces, for example, as the transfer procedure data corresponding to "142→243" within the recipe information, the transfer procedure data "14Core2out→14Core3in →24Core1out→24Core3in" and transmits it to the module control device.

In the module control device, the transfer procedure acquisition portion 17a, when acquiring the transfer procedure data from the system control device 2, supplies the transfer procedure data to the transfer destination determination portion 17b. The transfer destination determination portion 17b, when receiving the transfer procedure data, determines whether the transfer destination of the substrate indicated by the transfer procedure data is a module within the substrate processing device to which it belongs or is a module within another substrate processing device. If the transfer destination of the substrate is a module within the substrate processing device to which it belongs, the transfer destination determination portion 17b supplies the transfer procedure data to the local transfer portion 17c. On the other hand, if the transfer destination of the substrate is a module within another substrate processing device, the transfer destination determination portion 17b supplies the transfer procedure data to the device-to-device transfer portion 17d.

The local transfer portion 17c, when receiving the transfer procedure data, makes the transfer robot Tr1 or Tr2 within the substrate processing device to which it belongs perform an operation of transferring the substrate to the module of the transfer destination indicated by the transfer procedure data. The device-to-device transfer portion 17d, when receiving the transfer procedure data, makes the transfer robot Tr1 or Tr2 within the substrate processing device to which it belongs perform an operation of transferring the substrate to the core module within another substrate processing device indicated as the transfer destination by the transfer procedure data.

According to the present embodiment, the user only inputs the constituent information to the reception portion, and the setting portion 33 automatically sets the address of the process module and the address of the core module. Thus, it is possible to easily set the address of the process module and the address of the core module.

In the present embodiment, the imaginary field is configured in a lattice shape. Hence, as the identification information (field identification information) of each region, the row-column number that is information indicating the position of the region can be used. In this case, since the addresses of the core module and the process module also indicate the position of the module in the imaginary field, it is possible to determine the connection relationship between the modules based on the addresses.

In the present embodiment, the constituent information reception portion 32b that is constituent information reception means receives, as the constituent information, the system information using the core icon as a transfer device icon and the process icon as a processing device icon. In this case, the constituent information can be converted into information in which the connection state of each module is visually and easily recognized, and thus it is possible to easily produce the constituent information.

Although the embodiment has been described above, the application of the present invention is not limited to the above embodiment.

For example, the imaginary field can be a two-dimensional lattice (such as a triangular lattice, a quadrangle lattice or a hexagonal lattice) in which a unit lattice corresponding to the transfer chamber is polygonal or a three-dimensional lattice (for example, a case where the transfer chambers are connected vertically and horizontally) in which a unit lattice is three-dimensional. Here, for example, the imaginary field can be a two-dimensional lattice in which, for example, a unit lattice is a polygon having the same number of sides as the number of connection ports or a three-dimensional lattice (such as a triangular prism lattice, a cubic lattice or a hexagonal cylinder lattice) in which a unit lattice is a three-dimensional figure having the same number of planes as the number of connection ports.

Figure 6:
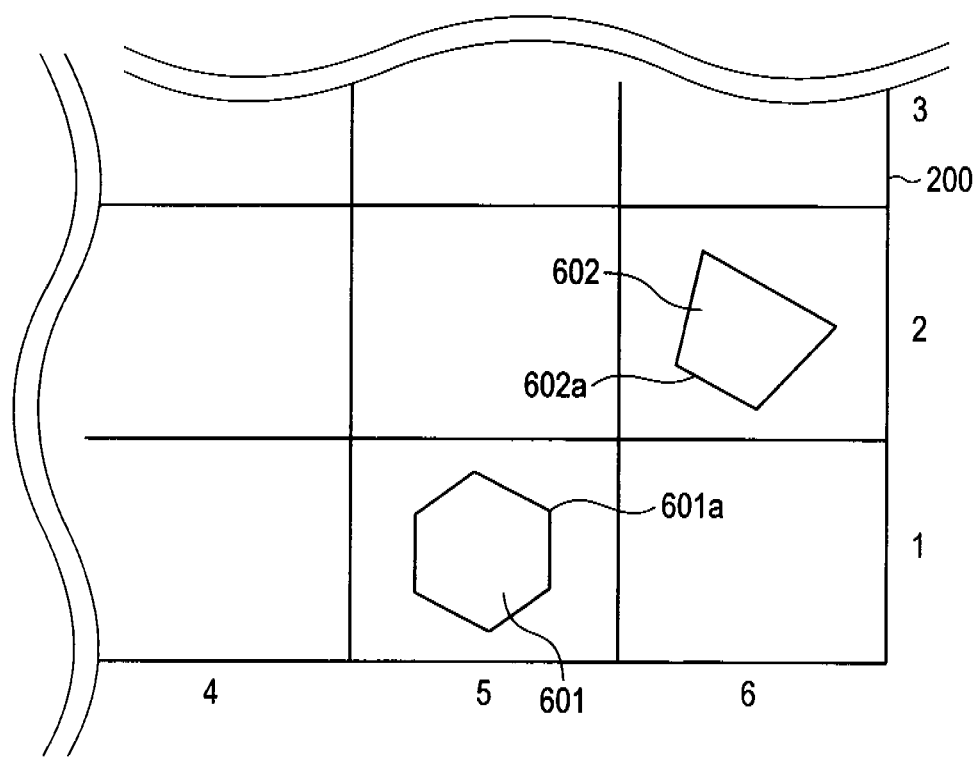
FIG. 6 is a diagram illustrating a case where the shape of a region of the imaginary field according to the embodiment of the present invention does not coincide with the shape of the core icon.

Furthermore, in the present embodiment, the shape of the core module (the shape of the core icon) may not be the same as the shape of the region of the imaginary field. For example, when, as shown in FIG. 6, the core module is hexagonal, a core icon 601 is hexagonal, a process module corresponding to a process icon 602 is connected to the connection port corresponding to a side 601a of the core icon 601, the following processing is preferably performed. The user operates the input device, and arranges the process icon 602 in a region in the second row and the sixth column of the imaginary field 200 such that the side 601a of the core icon 601 faces a connection portion specification portion 602a of the process icon 602. Here, the constituent information reception portion 32b is configured such that, in each side of the core icon, the side facing the connection portion specification portion of the process icon is recognized to be the connection portion to the process module. Hence, when a user input as shown in FIG. 6 is performed, the constituent information reception portion 32b accepts that a position in the first row and the fifth column of the imaginary field 200 is the arrangement position of the core module and that the connection port corresponding to the side 601a of the core icon 601 arranged in the first row and the fifth column is the connection portion.

Although the embodiment described above is applied to the core-type substrate processing device in which the process chambers are connected to the circumference of the transfer chambers, the present invention is not limited to this application. The present invention is also applicable to a substrate processing device of a type (for example, an in-line type) in which the transfer chamber having transfer means is further provided with a processing member and the transfer and the process can be performed together.

Although it is used as the address setting device, it is not limited to the address setting, and it may be used as a device for setting constituent information in the substrate processing device. Specifically, a device may be configured as the one in which, when a plurality of transfer chambers is connected to each other, the position where each transfer chamber is arranged is displayed as an image, and in which, on the other hand, the positions of the actually arranged transfer chamber and process chamber are specified, information on the transfer chamber and the process chamber is acquired and the correspondence between the information on the transfer chamber and the process chamber and the identification information is stored.

Although, as the address, an address obtained by adding an identification number of the connection port to the position information of the transfer chamber is used for the process chamber, for the process chamber, the position information may be set as the address. That is, although, in the present embodiment, the constituent information includes, as one element thereof, information indicating to which connection port of the core module the process module is connected, instead of such information, the arrangement position of the process module on the imaginary field may be included in the constituent information. In the present embodiment, since the field identification information is previously stored in the storage portion 31, if the arrangement position of the process module on the imaginary field can be specified, it is possible to acquire the field identification information corresponding to the arrangement position. Hence, the field identification information is preferably set at the address of the corresponding process module.

As described above, in the present embodiment, the address setting device 3 presents an imaginary field to the user, and makes the user specify, on the imaginary field, the region corresponding to the core module and the process module according to the actual arrangement. Then, the address setting device 3 determines the addresses of the core module and the process module based on the correspondence region corresponding to the core module and the process module and the field identification information stored in the storage portion 31.

The specification of the arrangement portion of the core module and the process module on the imaginary field is not limited to the method of using the icons shown in FIGS. 3A and 3B; the user may directly input it through the input device of the system control device 2. In this case, for example, the user may input, through the input device, information indicating that, in the imaginary field shown in FIG. 2, the core modules are arranged in the second row and the fourth column and in the first row and the fourth column of the imaginary field 200, and that the process modules are arranged in the first row and the third column, in the second row and the third column, in the third row and the fourth column, in the second row and the fifth column and in the first row and the fifth column. Since the field identification information for each region of the imaginary field 200 is stored in the storage portion 31, the setting portion 33 extracts the field identification information for the region specified by the user input, and thus it is possible to set the addresses of the core module and the process module.

Other Embodiments

Although, in the embodiment described above, as shown in FIG. 1, the system control device 2 is prepared separately from the substrate processing devices 1a to 1n, the function of the address setting device 3 may be included in at least one of the substrate processing devices 1a to 1n. That is, in the present invention, the arrangement position of the address setting device 3 is not important but it is important to configure the address setting device 3 such that, as in the embodiment described above, the addresses of the core module and the process module are produced.

A processing method of storing in a storage medium a program for operating the configuration of the embodiment described above to realize the function of the embodiment described above, of reading as a code a program stored in the storage medium and of performing it on a computer is also included in the scope of the embodiment described above. In other words, a computer readable storage medium is also included in the scope of the examples. Not only the storage medium in which the computer program is stored but also the computer program itself is included in the embodiments described above.

As the storage medium, for example, a floppy (registered trade mark) disc, a hard disk, an optical disc, a magnetic optical disc, a CD-ROM, a magnetic tape, a non-volatile memory card or a ROM can be used.

Not only a product that performs processing with only the program stored in the storage medium but also a product that operates on an OS together with other software and the function of an extension board to perform the operation of the embodiments described above is also included in the scope of the embodiments described above.

The invention claimed is:

1. An identification information setting device that gives, when a transfer chamber including substrate transfer means and a processing chamber are arranged in a predetermined arrangement relationship, an address to each of the transfer chamber and the processing chamber, the device comprising:
    display means that displays a region group for imaginarily developing the predetermined arrangement relationship, the region group including a plurality of regions;
    first storage means that stores identification information for specifying each of the plurality of regions of the region group;
    means that makes a user specify, in the region group displayed on the display means, an arrangement position of the transfer chamber and an arrangement position of the processing chamber by a first icon which corresponds to the transfer chamber and includes a plurality of sides each corresponding to a position of a connection port and a second icon which corresponds to the processing chamber and includes a connection portion specification portion for indicating a connection portion to the transfer chamber means that acquires constituent information including a correspondence region associated with the transfer chamber among the region group and information indicating a connection port to which the processing chamber is connected among a plurality of connection ports included in the transfer chamber according to an arrangement position of the transfer chamber specified by the first icon on the region group and an arrangement position of the processing chamber specified by the second icon on the region group; and means that gives an address to each of the transfer chamber and the processing by the constituent information and identification information stored in the first storage means for each of the plurality of regions included in the region group, wherein an identification value is allocated to each of the plurality of sides of the first icon, a side adjacent to a connection portion specification portion of a certain second icon among a plurality of sides of a certain first icon indicates a connection port of a transfer chamber corresponding to the certain first icon to a processing chamber corresponding to the certain second icon, the means that acquires the constituent information sets an arrangement position of the first icon in the region group to the correspondence region in the constituent information and sets the side of the first icon adjacent to the connection portion specification portion of the second icon in the region group to the connection port to which the processing chamber is connected in the constituent information, and the means that gives the address refers to the constituent information and the identification information to set the identification information corresponding to the correspondence region included in the constituent information to the address of the transfer chamber, and produces, for each of the processing chambers connected to the transfer chamber to which the address is given, based on information indicating the connection port included in the constituent information, information obtained by adding the identification value allocated to the connection port to the set address of the transfer chamber, and sets the information obtained by adding as the address of the processing chamber connected to the connection port.

2. The identification information setting device of claim 1, wherein the means that makes the user specify acquires information indicating to which connection port of the transfer chamber the processing chamber is connected, from the arrangement position of the processing chamber in the region group specified by the user, and the means that gives the address refers to the first storage means to acquire the identification information corresponding to the arrangement position of the transfer chamber in the region group specified by the user through the means that makes the user specify, sets the address of the transfer chamber based on the acquired identification information, and sets the address of the processing chamber based on the set address of the transfer chamber and the information indicating to which connection port of the transfer chamber the processing chamber is connected.

3. The identification information setting device of claim 1, wherein the means that gives the address refers to the first storage means to, acquire the identification information corresponding to each of the arrangement position of the transfer chamber in the region group and the arrangement position of the processing chamber in the region group specified by the user through the means that makes the user specify, and sets each of the addresses of the transfer chamber and the processing chamber based on the acquired identification information.

4. The identification information setting device of claim 1, wherein the identification information is the one on a position where each of the transfer chambers is arranged when a plurality of the transfer chambers is connected to each other.

5. The identification information setting device of claim 1, further comprising second storage means that stores each of the given addresses of the processing chambers and each of the processing chambers in association with each other.

6. The identification information setting device of claim 1, wherein the display means arranges the plurality of regions in a lattice pattern and displays the region group.

7. A non-transitory computer-readable storage medium that stores a computer readable program, wherein the non-transitory computer-readable storage medium stores a computer program comprising instructions that cause a computer to function as the identification information setting device of claim 1.

8. The identification information setting device of claim 1, wherein the display means is polygon display means that displays a polygon lattice as the region group in which a unit lattice corresponding to the region is a polygon having the same number of sides as the number of connection ports of the transfer chamber.

9. An identification information setting method of giving, when a transfer chamber including substrate transfer means and a processing chamber are arranged in a predetermined arrangement relationship, an address to each of the transfer chamber and the processing chamber, the method comprising:

a step of displaying a region group for imaginarily developing the predetermined arrangement relationship, the region group including a plurality of regions;

a step of making a user specify, in the region group displayed on a display means, an arrangement position of the transfer chamber and a connection port to which the processing chamber is connected among connection ports of the transfer chamber by a first icon which corresponds to the transfer chamber and includes a plurality of sides corresponding to a position of a connection port and a second icon which corresponds to the processing chamber and includes a connection portion specification portion for indicating a connection portion to the transfer chamber;

a step of acquiring constituent information including a correspondence region associated with the transfer chamber among the region group and information indicating a connection port to which the processing chamber is connected among a plurality of connection ports included in the transfer chamber according to an arrangement position of the transfer chamber specified by the first icon on the region group and an arrangement position of the processing chamber specified by the second icon on the region group; and a step of acquiring identification information corresponding to the arrangement position of the transfer chamber in the region group from the constituent information and identification information for specifying each of the plurality of regions of the region group, determining the address of the transfer chamber from the acquired identification information and determining the address of the processing chamber from the determined address of the transfer chamber and the constituent information, wherein an identification value is allocated to each of the plurality of sides of the first icon, a side adjacent to the connection portion specification portion of a certain second icon among the plurality of sides of a certain first icon indicates a connection port of the transfer chamber corresponding to the certain first icon to the processing chamber corresponding to the certain second icon, the step of acquiring the constituent information sets an arrangement position of the first icon in the region group to the correspondence region in the constituent information and sets the side of the first icon adjacent to the connection portion specification portion of the second icon in the region group to the connection port to which the processing chamber is connected in the constituent information, and the step of determining the address refers to the constituent information and the identification information to set the identification information corresponding to the correspondence region included in the constituent information as the address of the transfer chamber, and produces, for each of the processing chambers connected to the transfer chamber to which the address is given, based on information indicating the connection port included in the constituent information, information obtained by adding the identification value allocated to the connection port to the set address of the transfer chamber, and sets the information obtained by adding as the address of the processing chamber connected to the connection port.

* * * * *